United States Patent
Mathew et al.

(10) Patent No.: US 8,563,355 B2
(45) Date of Patent: Oct. 22, 2013

(54) METHOD OF MAKING A PHASE CHANGE MEMORY CELL HAVING A SILICIDE HEATER IN CONJUNCTION WITH A FINFET

(75) Inventors: Leo Mathew, Austin, TX (US); Tushar P. Merchant, Austin, TX (US); Ramachandran Muralidhar, Austin, TX (US); Rajesh A. Rao, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 429 days.

(21) Appl. No.: 12/016,739

(22) Filed: Jan. 18, 2008

(65) Prior Publication Data
US 2009/0184306 A1 Jul. 23, 2009

(51) Int. Cl.
*H01L 21/06* (2006.01)

(52) U.S. Cl.
USPC ..... 438/102; 438/479; 438/683; 438/E45.002

(58) Field of Classification Search
USPC ............... 438/102, 197, 238, 479, 585, 683, 438/E45.002
See application file for complete search history.

(56) References Cited

U.S. PATENT DOCUMENTS

| | | | |
|---|---|---|---|
| 4,599,705 A * | 7/1986 | Holmberg et al. | 365/163 |
| 5,780,919 A * | 7/1998 | Chua et al. | 257/530 |
| 6,221,764 B1 | 4/2001 | Inoue | |
| 6,319,799 B1 | 11/2001 | Ouyang et al. | |
| 6,545,287 B2 | 4/2003 | Chiang | |
| 6,605,821 B1 * | 8/2003 | Lee et al. | 257/2 |
| 6,800,563 B2 | 10/2004 | Xu | |
| 6,838,692 B1 | 1/2005 | Lung | |
| 6,846,734 B2 | 1/2005 | Amos et al. | |
| 6,967,175 B1 * | 11/2005 | Ahmed et al. | 438/753 |
| 7,075,131 B2 | 7/2006 | Chen | |
| 7,238,601 B2 * | 7/2007 | Mathew et al. | 438/596 |
| 7,479,671 B2 | 1/2009 | Breitwisch et al. | |
| 7,598,112 B2 | 10/2009 | Park et al. | |
| 7,719,039 B2 | 5/2010 | Muralidhar et al. | |
| 7,811,851 B2 | 10/2010 | Muralidhar et al. | |
| 8,043,888 B2 * | 10/2011 | Mathew et al. | 438/102 |
| 2005/0023633 A1 * | 2/2005 | Yeo et al. | 257/500 |
| 2005/0029503 A1 | 2/2005 | Johnson | |

(Continued)

OTHER PUBLICATIONS

Lankhorst:"Low-cost and nanoscale non-volatile memory concept for future silicon chips"; Philips Research Laboratories, the Netherlands.

(Continued)

*Primary Examiner* — Anh Mai
(74) *Attorney, Agent, or Firm* — Mary Jo Bertani; David G. Dolezal

(57) ABSTRACT

A phase change memory (PCM) cell includes a transistor, a PCM structure, and a heater. The transistor has a first current electrode and a second current electrode in a structure, and a channel region having a first portion along a first sidewall of the structure and having a second portion along a second sidewall of the structure. The second sidewall is opposite the first sidewall. The transistor has a control electrode that has a first portion adjacent to the first sidewall and a second portion adjacent to the second sidewall. The PCM structure exhibits first and second resistive values when in first and second phase states, respectively. The heater is on the structure and produces heat when current flows through the heater for changing the phase state of the phase change structure.

10 Claims, 6 Drawing Sheets

(56) References Cited

U.S. PATENT DOCUMENTS

| | | | |
|---|---|---|---|
| 2005/0110983 A1* | 5/2005 | Jeong et al. | 356/148 |
| 2006/0177998 A1* | 8/2006 | Lin et al. | 438/585 |
| 2007/0069249 A1* | 3/2007 | Hayakawa | 257/246 |
| 2007/0096206 A1* | 5/2007 | Chidambarrao | 257/347 |
| 2007/0097738 A1 | 5/2007 | Asano et al. | |
| 2007/0161171 A1* | 7/2007 | Burnett et al. | 438/197 |
| 2008/0186760 A1 | 8/2008 | Elmegreen et al. | |
| 2008/0224178 A1* | 9/2008 | Pacha et al. | 257/208 |
| 2008/0251779 A1* | 10/2008 | Kakoschke et al. | 257/5 |
| 2009/0184309 A1* | 7/2009 | Mathew et al. | 257/4 |
| 2010/0001248 A1 | 1/2010 | Wouters et al. | |
| 2010/0117045 A1* | 5/2010 | Lee et al. | 257/2 |

OTHER PUBLICATIONS

Non-Published U.S. Appl. No. 11/864,257, filed Sep. 28, 2007, and first named inventor Ramachandran Muralidhar.

Non-Published U.S. Appl. No. 11/864,246, filed Sep. 28, 2007, and first named inventor Ramachandran Muralidhar.

Office Action mailed Jul. 22, 2010 in U.S. Appl. No. 12/016,733.

Chen et al.; "Ultra-Thin Phase-Change Bridge Memory Device Using GeSb"; IEDM Technical Digest; 2006; 4 Pgs.; IEEE.

Merget et al.; "Lateral phase change random access memory cell design for low power operation"; Microsystem Technologies Technical Paper Ver. 13; 2007; pp. 169-172; Microsystem Technologies.

Quirk et al.; "Semiconductor Manufacturing Technology"; 2001; pp. 309-312; Pearson Education International/ Prentice Hall.

Nishi; "Current Trends and Status of Nanoelectronic Devices"; 2005 SINANO Workshop, Grenoble, France; 38 Pgs.

Zhang et al.; "An Integrated Phase Change Memory Cell With Ge Nanowire Diode for Cross-Point Memory"; 2007 Symposium on VLSI Technology Digest of Technical Papers; pp. 98-99; IEEE.

Kim, SB, et al., "Integrating Phase-Change Memory Cell with Ge Nanowire Diode for Crosspoint Memory—Experimental Demonstration and Analysis", IEEE Transactions on Electron Devices, vol. 55, No. 9, Sep. 2008, pp. 2307 and 2313.

Office Action, U.S. Appl. No. 12/016,733, Restriction, dated Aug. 21, 2009.

Office Action, U.S. Appl. No. 12/016,733, Non-Final Rejection, dated Jan. 13, 2010.

Office Action, U.S. Appl. No. 12/016,733, Non-Final Rejection, dated Dec. 27, 2010.

U.S. Appl. No. 12/016,733, Office Action, Rejection, Mailed Mar. 30, 2011.

U.S. Appl. No. 12/016,733, Office Action, Notice of Allowance, Mailed May 10, 2011.

U.S. Appl. No. 12/016,733, Office Action—Notice of Allowance, Aug. 30, 2011.

U.S. Appl. No. 13/238,791, Leo Mathew, "Phase Change Memory Cell With FINFET and Method Therefor", filed Sep. 21, 2011, Office Action—Rejection, mailed Apr. 16, 2012.

U.S. Appl. No. 13/238,791, Inventor Leo Mathew, "Phase Change Memory Cell with Heater and Method Therefor", filed Sep. 21, 2011, Office Action—Final Rejection, mailed Sep. 28, 2012.

\* cited by examiner

METHOD OF MAKING A PHASE CHANGE MEMORY CELL HAVING A SILICIDE HEATER IN CONJUNCTION WITH A FINFET

CROSS-REFERENCE TO RELATED APPLICATION(S)

This application is related to U.S. patent application Ser. No. 12/016,733, filed on even date herewith, entitled "Phase Change Memory Cell with Heater and Method Therefor," naming Leo Mathew, Darmesh Jawarani, Tushar Merchant, and Ramachandran Muralidhar, as inventors, and assigned to the current assignee hereof.

BACKGROUND

1. Field

This disclosure relates generally to integrated circuit memories, and more specifically, to phase change memory cells.

2. Related Art

A relatively new type of memory known as a phase change memory has been introduced which offers some advantage over existing non-volatile memories (NVMs). The phase change memory operates on the principle that there are phase change materials (PCMs) that change resistance upon a phase change and this change in resistance is reversible. One such material is a combination of germanium, antimony, and tellurium and is known as GST. The PCM is heated for a relatively short time and quickly cooled to achieve an amorphous state, which is high resistance. The PCM is heated at a lower temperature but for a longer time to achieve a crystalline state, which is low resistance. The difference in resistance is detectable and thus useful for defining two different logic states. One of the difficulties, however, is obtaining enough heat in order to achieve the amorphous state. Typically, heaters are metal that are either over and under the PCM or where the metal makes contact to the PCM in two locations on the top side. In the case of over and under, there are then multiple levels of vias required just to contact the PCM. In the case of both vias on the top side, the PCM must be big enough to have two contacts made to it. Also the contacts are preferably tapered to increase the resistance and thus the heat. Resistance is preferably not too low because the current is limited by transistors so that the heat is directly related to the resistance over an operable range.

Another issue with this type of memory is that contact between the PCM and a transistor must be made. The PCM must also make contact to a reference or a bit line. In either case that means that vias are required for two locations on a PCM.

Thus, there is a need for improving upon the issues pointed out above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a semiconductor device has a phase change material (PCM) contacted by silicide on silicon. The silicon is shaped so as to provide high resistance and the silicide is formed after the silicon has been shaped. Thus, the shaping is achieved using silicon which is easier to form into a desired shape than metal typically is. A silicide material, which is better for being a heater for the PCM, is then formed into the desired shape formed in the silicon. In another aspect, a silicon fin is used for both a select transistor and the silicon used for providing the high resistance shape. This is better understood by reference to the drawings the following description.

In another aspect, a circuit has a FinFET transistor which is coupled to a phase change memory cell. The fin that is used in forming the FinFET has a portion that is silicided. The silicided portion is used as the heater for the phase change memory cell. This is better understood by reference to the drawings the following description.

Figure 1:
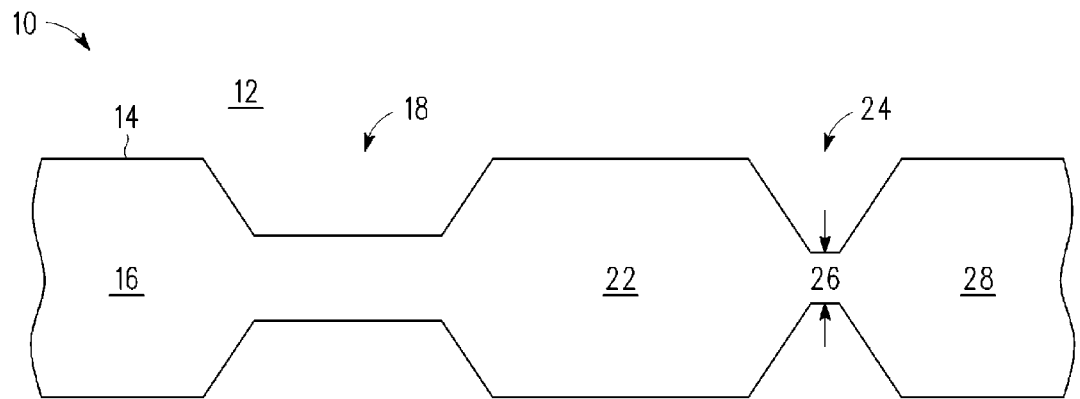
FIG. 1 is a top view of a semiconductor device at a stage in processing according to an embodiment.

Shown in FIG. 1 is a semiconductor device 10, having an insulating layer 12, and a fin 14 over insulating layer 12. Fin 14 has a source/drain portion 16, a source/drain portion 22, and a contact portion 28. Between source/drain portions 16 and 22 is a channel region 18 that has reduced width. Between source/drain region 22 and contact region 28 is a PCM region where a PCM will be formed. PCM region 24 has a width 26 which may be for example, 15 to 20 nanometers (nm). Regions 16, 22, and 28 are intentionally not rectangular with 90 degree corners. The corner angles may be 45 degrees. In this case of regions 22 and 28, the corners are leading to region 24 are at angle so as to provide a shape that is better for heating. Regions 16 and 22 are angled away from channel region 18 to reduce capacitance between the gate and drain and between the gate and source. Fin 14 in this example is preferably monocrystalline silicon but may be another material preferably suitable for transistor and silicide formation.

Figure 2:
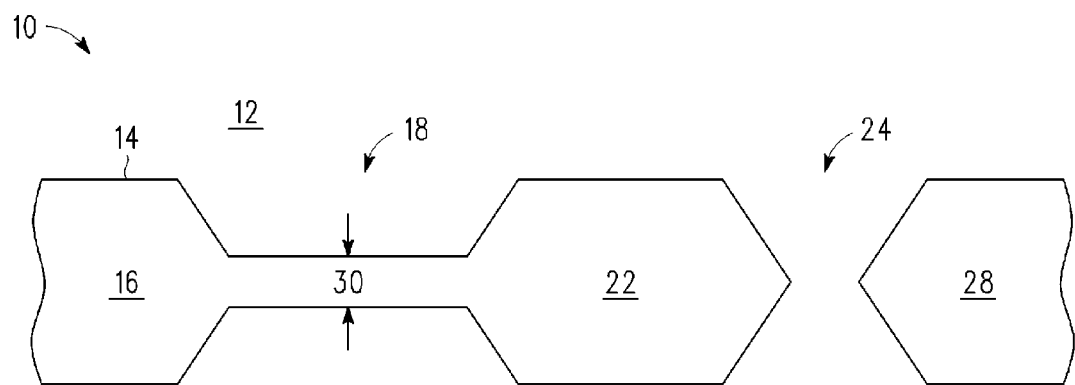
FIG. 2 is a top view of the semiconductor device of FIG. 1 at a subsequent stage in processing.

Shown in FIG. 2 is semiconductor device 10 after a trimming step which is an unmasked isotropic etch step. An effective etchant is a dry etch using bromine or chlorine. The result of the isotropic etch is to reduce fin 14 in all three dimensions and removing the silicon between regions 22 and 28. This leaves regions 22 and 28 with points at the interface with region 24. This is an effective shape for generating heat with current flow through the point areas. This shape increases the current density and thus the heat. Channel region 18 is thinned to a width 30 as the desirable width for fin 14 at the channel, which may be 15 nm. Regions 16 and 28 remain large enough so that contacts may be formed on them.

Region 22 is shaped for heat on the side next to PCM region 24 and reduced capacitance on the side adjacent to channel region 18.

Figure 3:
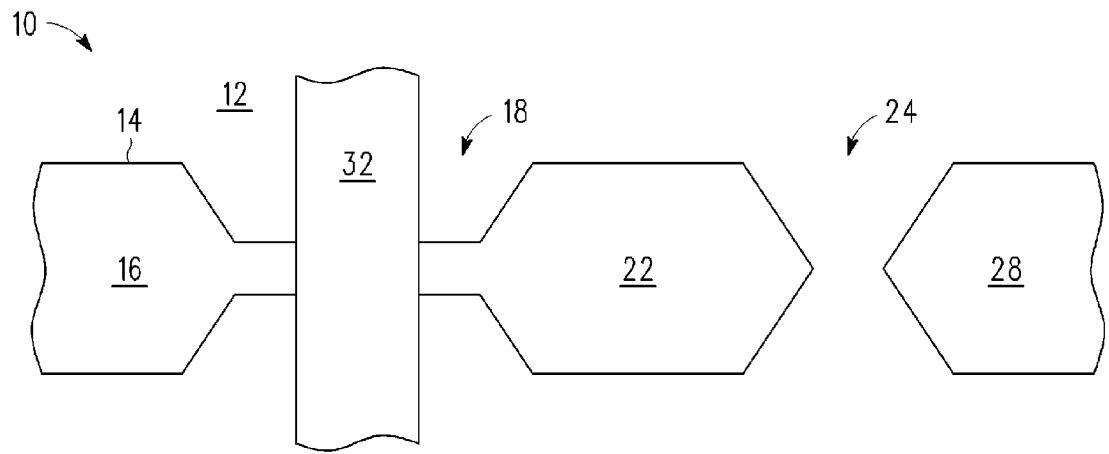
FIG. 3 is a top view of the semiconductor device of FIG. 2 at a subsequent stage in processing.

Shown in FIG. 3 is semiconductor device 10 after forming a gate stack 32 over channel region 18. Gate stack 32 includes a gate dielectric on channel region 18 and a gate electrode 32 on the gate dielectric. The gate dielectric may be oxide but also may be another insulating layer useful for gate dielectrics such high k dielectrics. Gate electrode 32 may be just polysilicon but may also be metal or combination of metal layers and may or may not further include polysilicon. The width of gate stack 32 is used in determining the channel length for the transistor to be formed using channel region 18, gate stack 32, source/drain region 16, and source/drain region 22. Transistors using fins, known as FinFETs, typically would not be expected to have extension implants, but if an extension implant is desired, it may be done to semiconductor 10 shown in FIG. 3.

Figure 4:
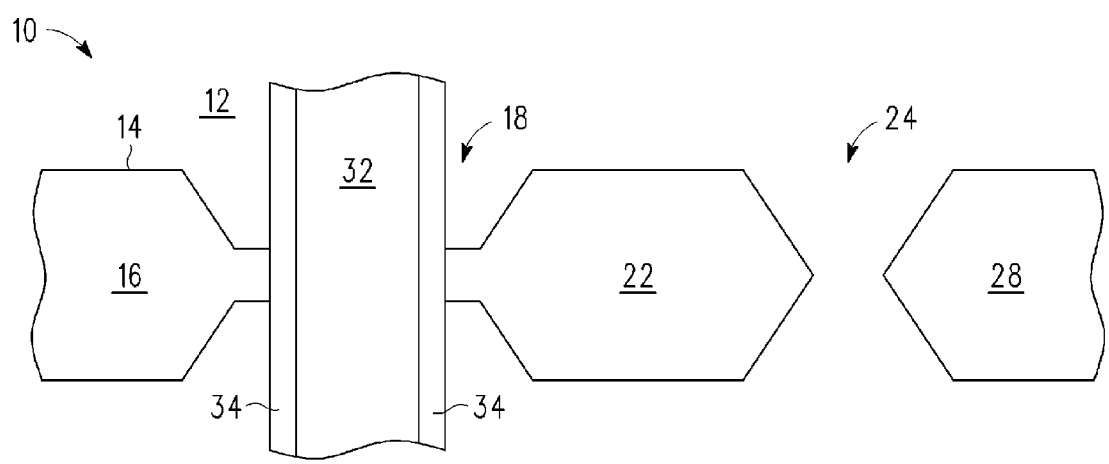
FIG. 4 is a top view of the semiconductor device of FIG. 3 at a subsequent stage in processing.

Shown in FIG. 4 is semiconductor device 10 after forming a sidewall spacer 34 around gate stack 32. A source/drain implant is performed on semiconductor device 10 as shown in FIG. to form deep source/drains. Subsequent processing is sufficient to cause the implanted regions to expand.

Figure 5:
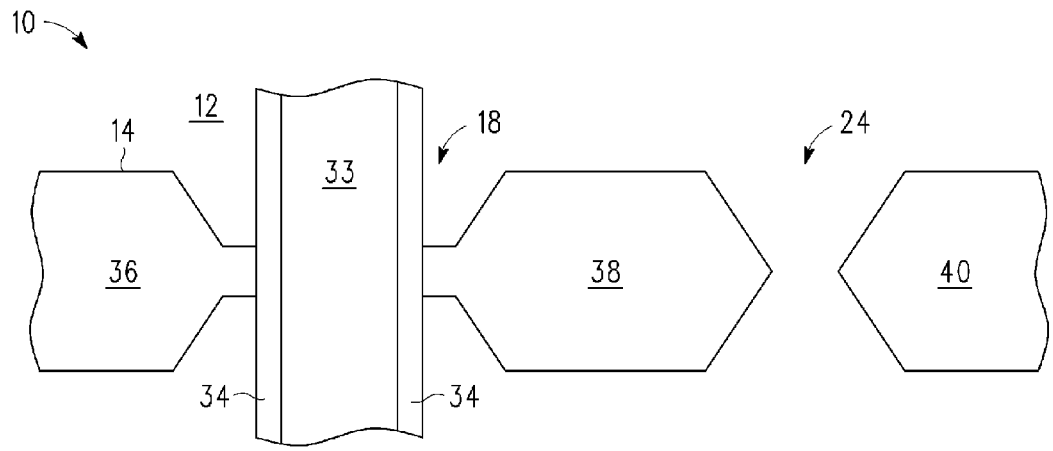
FIG. 5 is a top view of the semiconductor device of FIG. 4 at a subsequent stage in processing.

Shown in FIG. 5 is semiconductor device 10 after forming silicide region 36 in source/drain region 16, silicide region 38 in source/drain region 22, silicide region 33 in gate stack 32, and silicide region 40 in contact region 28. Sidewall spacer 34 provides insulation between gate stack 32 and the siliciding of source/drain regions 36 and 38. The silicide used may be cobalt silicide. Cobalt silicide is beneficial due to its thermal stability. Other silicides may also be effective.

Figure 6:
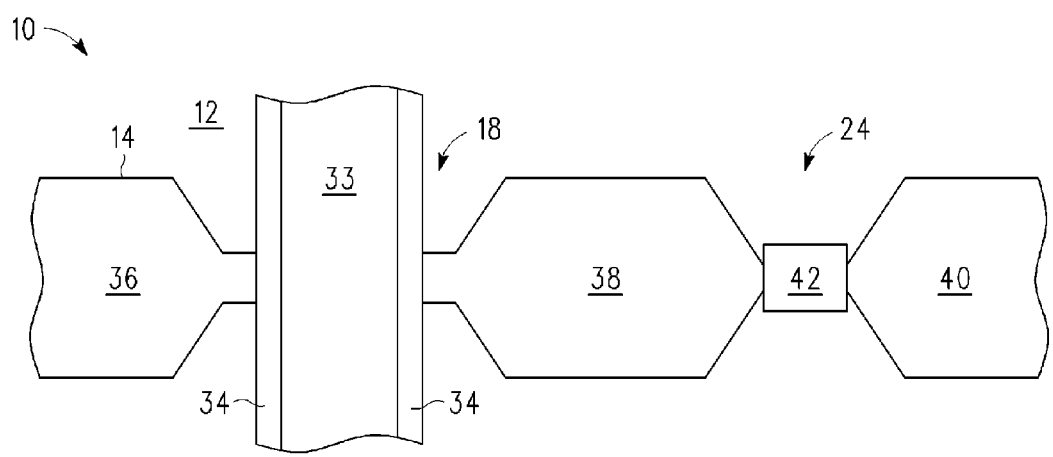
FIG. 6 is a top view of the semiconductor device of FIG. 5 at a subsequent stage in processing.

Shown in FIG. 6 is semiconductor device 10 after forming a PCM 42 in PCM region 24 contacting silicide regions 38 and 40. PCM 42 may be a combination of germanium, atimony, and tellurium (GST). The amount of silicide contacting PCM 42 is quite small as regions 38 and 40 come to a point where PCM 42 is contacted.

Figure 7:
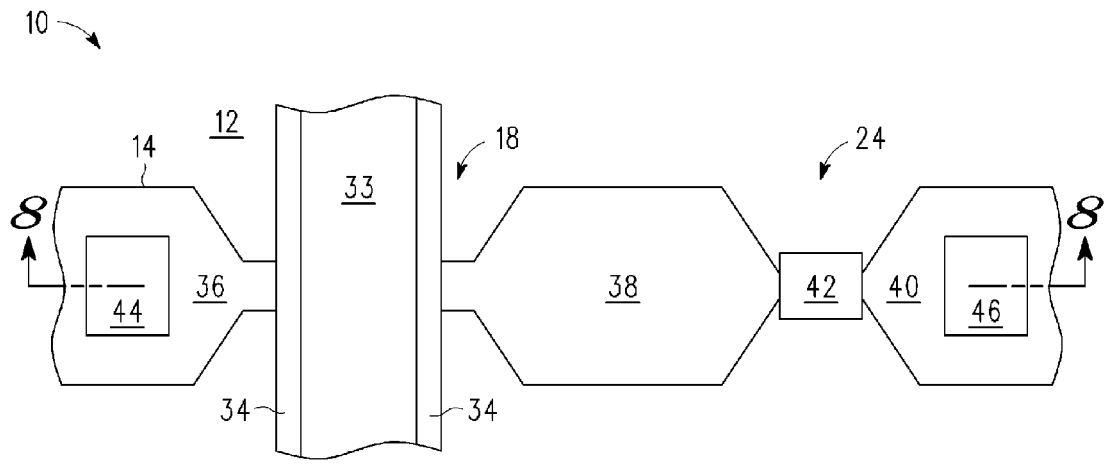
FIG. 7 is a top view of the semiconductor device of FIG. 6 at a subsequent stage in processing.

Shown in FIG. 7 is semiconductor device 10 after forming contact 44 on silicide region 36 and contact 46 on silicide region 40. There is also a contact to silicide region 33 at a location away from channel region 18 not shown in FIG. 7. Semiconductor device 10 of FIG. 7 is a completed PCM cell which can be included in a memory array.

Figure 8:
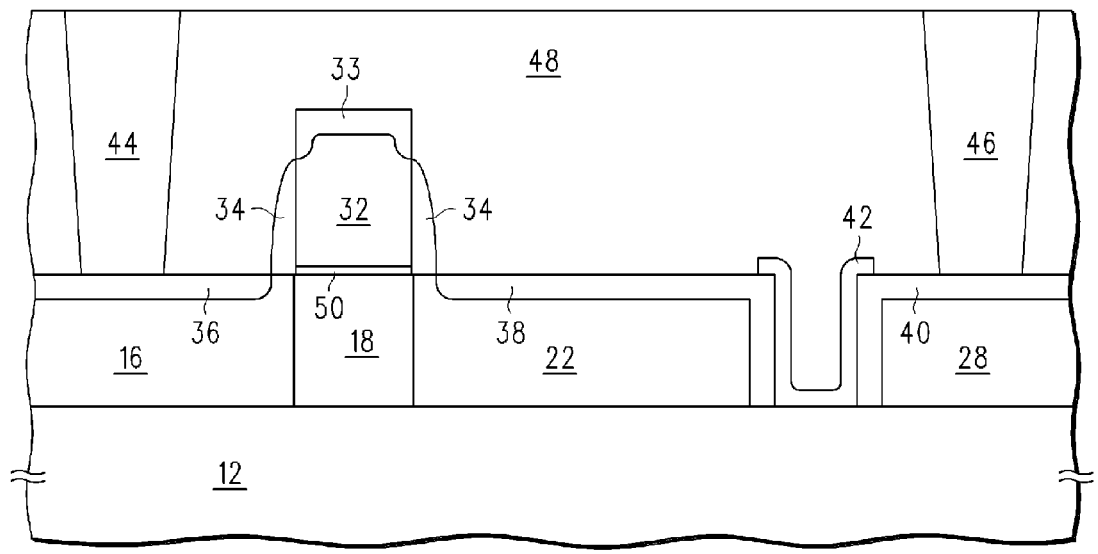
FIG. 8 is a cross section of the semiconductor device of FIG. 7.

Shown in FIG. 8 is a cross section of semiconductor device 10 of FIG. 7 through 7-7 shown in FIG. 7. This shows contacts 44 and 46 through an interlayer dielectric layer (ILD) 48 which is deposited over silicide regions 36, 33, 38, and 40, sidewall spacer 34, and PCM 42. PCM 42 can be relatively thin such as 20 nm. PCM 42 is along the pointed edge of silicide regions 38 and 40. Silicide regions 36, 33, 38 and 40 penetrate into source/drain region 36, gate stack 32, source/drain region, and contact region 28, respectively. The penetration may be 20 nm. The diffusion of the source/drain implant, which is used in defining the channel length, is shown to almost to line up with gate stack 32, which is sufficient for transistor operation. The fin height may be 100 nm. With cobalt silicide as the silicide, the pointed area contacting PCM 42 is more highly resistive than some silicides and thus makes a better heater. On the other hand, cobalt silicide is still relatively low resistance making a good contact surface for contacts 44 and 46 making contact to source/drain region 16 and contact region 46. Further cobalt silicide has high thermal stability which makes it particularly useful as a heater. Thus, cobalt silicide is believed to have particular benefits but other silicides may also be found to be effective. Thus, a PCM cell has a transistor connected to PCM 42 which can provide the current needed by application of the proper voltages to contacts 44 and 46 and to a contact that electrically contacts gate stack 32. After programming, the transistor formed of source/drains 16 and 22 and gate stack 32 can providing coupling of PCM 42 to a bit line of a memory array.

With contact region 28 and drain region 22 being symmetric with each other at the interface with PCM region 24, heating occurs from silicide region 38 in contact with PCM 42 and silicide region 40 in contact with PCM 42 substantially equally. This heating from both sides helps lower the overall power consumption of the device, especially when the PCM is confined to a small volume. In many cases in the prior art, especially with vertical heating, heating only occurs from one side. Thus the heating of the PCM is uneven and can result in inadequate heating in some portion of the PCM and/or undesirably slow heating.

Figure 9:
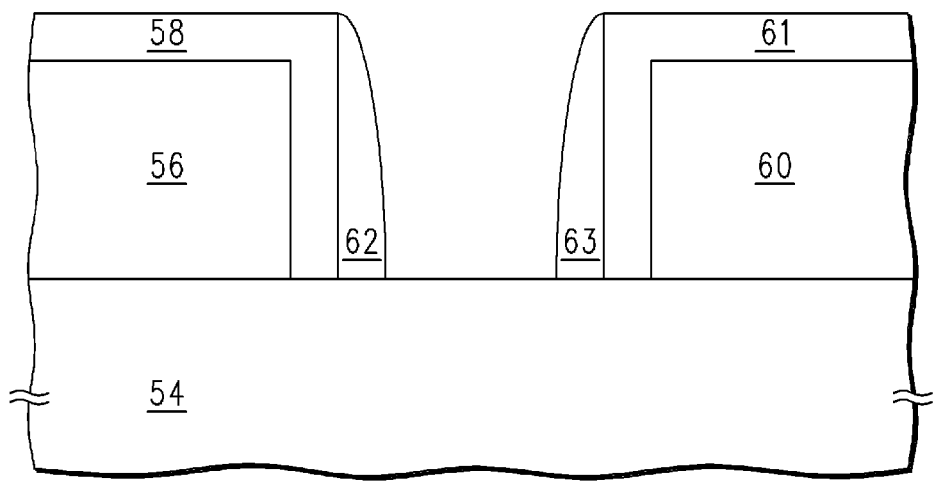
FIG. 9 is a cross section of a portion of a semiconductor device at a stage in processing according to another embodiment.

Shown in FIG. 9 is an alternative PCM structure 52, shown in cross section, to that shown in FIGS. 1-8 for PCM region 24 and PCM 42. PCM structure 52 has a source/drain region 56 with a silicide layer 58 in it and a contact region 60 which has a silicide layer 61 in it. Regions 56 and 60 and thus silicide layers 58 and 61 come to a point as shown for regions 22, 28, 38, and 40 shown in FIGS. 1-8. PCM structure 52 further includes sidewall spacers 62 and 63 that are formed of a metal different from that used in forming silicide layers 58 and 61. In this example, silicide layers 58 and 61 are chosen for optimizing their use for contacting, and sidewall spacers 62 and 63 are chosen for optimizing the use as a heater. For example, silicide layers 58 and 61 may be nickel silicide and sidewall spacers 62 and 63 may be tantalum silicide. Titanium nitride and tantalum nitride could also be useful heater materials for sidewall spacers 62 and 63. Use of sidewall spacers 62 and 63 are formed in the convenient manner of conformal deposition and anisotropic etch back that contours the resulting structure to the shape of the existing sidewall that does not require the benefits of the selective deposition provided by siliciding. Thus the materials for sidewall spacers 62 and 63 are not constrained to being a silicide. A variety of issues may be involved in optimizing the materials for silicide layers 58 and 61 and sidewall spacers 62 and 63 other than just resistance. Thermal stability is one. Another is resistance to diffusion.

Figure 10:
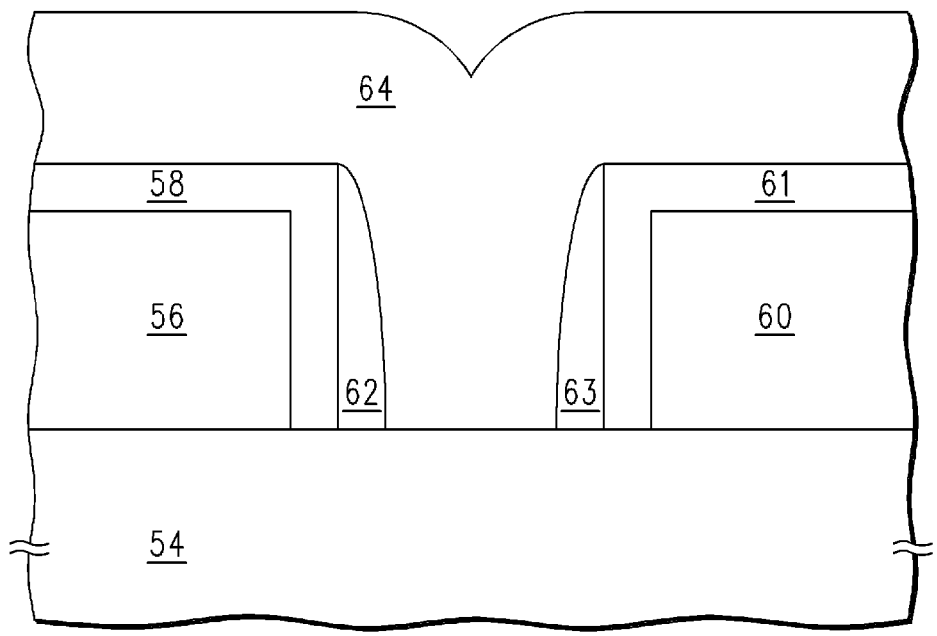
FIG. 10 is a cross section of the portion of the semiconductor device of FIG. 9 at a subsequent stage in processing.

Shown in FIG. 10 is PCM structure 52 after depositing PCM material to form PCM layer 64. PCM layer 64 is deposited to a thickness a little greater than half the amount of the opening between sidewall spacers 62 and 63. This results in filling the opening so that PCM layer 64 is thicker over the opening than over silicide regions 58 and 61.

Figure 11:
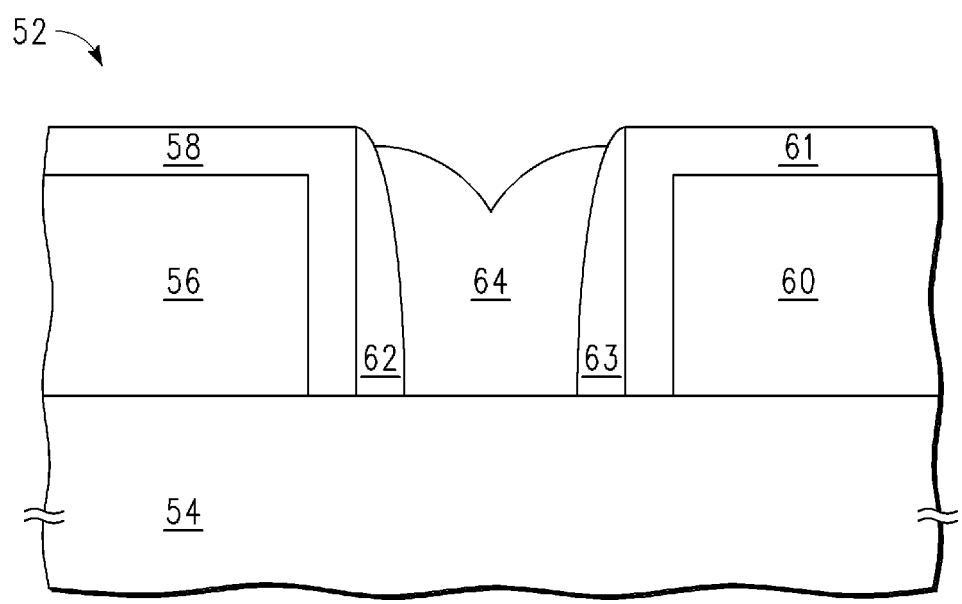
FIG. 11 is a cross section of the portion of the semiconductor device of FIG. 10 at a subsequent stage in processing.

Shown in FIG. 11 is PCM structure 52 after performing an anisotropic etch performed sufficiently long to remove PCM layer 64 from silicide layers 58 and 61. It may desirable to continue etching until layer 64 is as thin as possible without separating. By having PCM layer 64 below sidewall spacers 62 and 63, all of the programming current from source/drain regions 56, contact region 60, and silicide regions 58 and 61 will pass through sidewall spacers 62 and 63 which were optimized for heating. It is desirable to recess PCM layer 64 so that PCM layer 64 did not contact silicide layer 58 or 61. If PCM layer 64 were left in contact with silicide layers 58 and 61, much of the programming current would pass directly from silicide layers 58 and 61 into PCM layer 64 thus bypassing sidewall spacers 62 and 63. This would result in losing at least some of the benefit of using sidewall spacers 62 and 63.

By now it should be appreciated that there has been provided a method of making a circuit including a phase change memory cell. The method includes forming a structure including silicon. The method further includes forming a transistor, the transistor including a channel region having a first portion located along a first sidewall of the structure including silicon and having a second portion located along a second sidewall of the structure including silicon, the second sidewall being an opposing sidewall to the first sidewall. The forming the transistor includes forming a control electrode, the control electrode having a first portion adjacent to the first sidewall for controlling conductivity in the first portion of the channel region and a second portion adjacent to the second sidewall for controlling conductivity in the second portion of the channel region. The forming the transistor further includes forming a first current electrode in the structure including silicon and forming a second current electrode in the structure including silicon. The method further includes forming a phase change memory cell electrically coupled to the transistor, the transistor controlling current for changing the phase state of the phase change memory cell. The forming the phase change memory cell includes forming a phase change structure wherein the phase change structure exhibits a first resistive value when in a first phase state and exhibits a second resistive value when in a second phase state. The forming the phase change memory cell further includes forming a heater, the heater producing heat when current flows through the heater for changing the phase state of the phase change structure, wherein forming a heater includes siliciding the structure including silicon to form a first silicide structure, the heater including the first silicide structure. The siliciding may include siliciding at least a portion of a third sidewall of the structure including silicon to form a sidewall silicide structure, wherein the heater includes the sidewall silicide structure. A portion of the phase change structure may be located over the sidewall silicide structure. The forming the phase change structure may include forming a layer of phase change material over a wafer, the wafer including the structure, and the method may further include patterning the layer to leave the phase change structure, wherein a portion of the phase change structure is located at an area adjacent to the structure including silicon over an insulator layer, wherein the structure including silicon is located over the insulating layer. The silicide may include cobalt. The method may further comprise forming a contact to an electrode of the transistor, wherein the siliciding includes forming an electrode silicide on an electrode of the transistor, wherein the contact electrically contacts the electrode silicide. The electrode may be a control electrode. The electrode may be a current electrode formed in the structure including silicon. The forming the structure including silicon may include forming the structure including silicon having a first width, oxidizing the silicide structure to form an oxidized layer, and removing the oxidize layer, wherein first width is reduced by the oxidizing. The method may further comprise providing a second structure including silicon, the second structure and the structure including silicon are each located over an insulator layer, the first structure being physically separate from the second structure including silicon, wherein the first structure including silicon is electrically coupled to the second structure including silicon via the phase change structure. The siliciding may further include siliciding at least a portion of a third sidewall of the structure including silicon to form a first sidewall silicide structure, wherein the heater includes the sidewall silicide structure, and siliciding a sidewall of the second structure to form a second silicided sidewall, wherein the phase change structure is located over and electrically coupled to the second silicided sidewall structure and the first silicided sidewall structure, wherein the heater includes the second silicided sidewall structure. The providing the first structure including silicon and the second structure including silicon may further include providing a wafer with a layer including silicon over an insulator layer, patterning the insulator layer to form a third structure including silicon, and thinning the third structure including silicon wherein the thinning the third structure including silicon separates the third structure into at least the first structure including silicon and the second structure including silicon. The phase change material may physically contact the first silicide structure.

Also described is a method of forming a phase change memory cell. The method includes providing a wafer having a layer including silicon located over an insulating layer. The method further includes forming a first structure including silicon and a second structure including silicon physically separated from the first structure including silicon, wherein the forming includes removing material from the layer including silicon at a location between the first structure including silicon and the second structure including silicon. The method further includes forming a transistor, the transistor including a channel region having a first portion located along a first sidewall of the first structure including silicon and having a second portion located along a second sidewall of the first structure including silicon, the second sidewall being an opposing sidewall to the first sidewall. The forming the transistor includes forming a control electrode, the control electrode having a first portion adjacent to the first sidewall for controlling conductivity in the first portion of the channel region and a second portion adjacent to the second sidewall for controlling conductivity in the second portion of the channel region. The forming the transistor further includes forming a first current electrode in the structure including silicon and forming a second current electrode in the structure including silicon. The method further including siliciding at least a portion of the first structure including silicon to form a first silicide structure and a portion of the second structure including silicon to form a second silicide portion, the first silicide structure and the second silicide structure are physically separate. The method further including forming a phase change memory cell electrically coupled to the transistor by the first silicide structure, the transistor controlling current for changing the phase state of the phase change memory cell. The forming the transistor includes forming a phase change structure wherein the phase change structure exhibits a first resistive value when in a first phase state and exhibits a second resistive value when in a second phase state, wherein the phase change structure includes a portion over the insulator material and located in between the first structure including silicon and the second structure including silicon at a location where the layer including silicon was removed, wherein current for changing the phase state of the phase change structure flows through the first silicide structure and the second silicide structure. The first silicide structure may include a first sidewall silicide portion, and the second silicide structure may include a second sidewall silicide portion. The siliciding may include siliciding a second portion of the first structure to form a third silicide structure, wherein the third silicide structure physically contacts the first current electrode. The first silicide structure and the second silicide structure may include cobalt.

Described too is a phase change memory cell. The phase change memory cell includes a transistor, the transistor including a first current electrode and a second current electrode located in a structure including silicon, the transistor including a channel region having a first portion located along a first sidewall of the structure including silicon and having a second portion located along a second sidewall of the structure including silicon, the second sidewall being an opposing sidewall to the first sidewall, the transistor including a control electrode, the control electrode having a first portion adjacent to the first sidewall for controlling conductivity in the first portion of the channel region and a second portion adjacent to the second sidewall for controlling conductivity in the second portion of the channel region. The phase change memory cell further includes a phase change memory structure, the phase change memory structure exhibits a first resistive value when in a first phase state and exhibits a second resistive value when in a second phase state. The phase change memory cell further includes a heater including a silicide structure located on the structure including silicon, the heater producing heat when current flows through the heater for changing the phase state of the phase change structure. The structure may include silicon being located over an insulator, and the phase change memory structure may include a first portion located over the silicide structure and a second portion located over the insulator with no portion of the silicide structure or structure including silicon located between the insulator and the second portion of the phase change memory structure. The heater may further include a second silicide structure physically separate from the silicide structure, wherein the phase change memory structure electrically couples the silicide structure and the second silicide structure.

Although the invention is described herein with reference to specific embodiments, various modifications and changes can be made without departing from the scope of the present invention as set forth in the claims below. For example, several alternatives for the heater were described but yet other alternatives may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a circuit including a phase change memory cell, the method comprising:
   forming a structure including silicon;
   forming a transistor, the transistor including a channel region having a first portion located along a first sidewall of the structure including silicon and having a second portion located along a second sidewall of the structure including silicon, the second sidewall being an opposing sidewall to the first sidewall, wherein the forming the transistor includes:
      forming a control electrode, the control electrode having a first portion adjacent to the first sidewall for controlling conductivity in the first portion of the channel region and a second portion adjacent to the second sidewall for controlling conductivity in the second portion of the channel region; and
      forming a first current electrode in the structure including silicon and forming a second current electrode in the structure including silicon;
   forming a separation region in the structure including silicon between the first current electrode and a contact region to form a contact sidewall on the first current electrode in the separation region;
   forming a heater comprising forming a heater silicide adjacent to the contact sidewall in the separation region; and
   after forming the heater, forming a phase change structure in the opening in contact with the heater silicide wherein the phase change structure exhibits a first resistive value when in a first phase state and exhibits a second resistive value when in a second phase state, wherein the phase change structure wraps around a pointed corner of the heater.

2. The method of claim 1 wherein the forming the heater silicide includes:
   siliciding the contact sidewall.

3. The method of claim 1 wherein the forming the phase change structure includes forming a layer of phase change material over a wafer, the wafer including the structure, the method further comprising:
   patterning the layer to leave the phase change structure in the separation region.

4. The method of claim 1 wherein the heater silicide includes cobalt.

5. The method of claim 1 wherein the forming the structure including silicon includes forming the structure including silicon having a first width, oxidizing the silicon structure to form an oxidized layer, and removing the oxidized layer, wherein first width is reduced by the oxidizing.

6. A method of forming a phase change memory cell, the method comprising:
   providing a wafer having a layer including silicon located over an insulating layer;
   forming a first structure including silicon and a second structure including silicon physically separated from the first structure including silicon, wherein the forming includes removing material from the layer including silicon at a location between the first structure including silicon and the second structure including silicon to form a separation region between the first structure and the second structure by which a contact sidewall is formed on a first current electrode in the separation region;
   forming a transistor, the transistor including a channel region having a first portion located along a first sidewall of the first structure including silicon and having a second portion located along a second sidewall of the first structure including silicon, the second sidewall being an opposing sidewall to the first sidewall, wherein the forming the transistor includes:
      forming a control electrode, the control electrode having a first portion adjacent to the first sidewall for controlling conductivity in the first portion of the channel region and a second portion adjacent to the second sidewall for controlling conductivity in the second portion of the channel region;
      forming the first current electrode in the first structure including silicon and forming a second current electrode in the first structure including silicon;
   forming a heater comprising forming a heater silicide adjacent to the contact sidewall in the separation region and over a portion of the first current electrode;
   forming a phase change memory cell electrically coupled to the transistor by the heater along the contact sidewall, the transistor controlling current for changing a phase state of the phase change memory cell, the forming the phase change memory cell includes:

after forming the heater, forming a phase change structure in the separation and in contact with the heater along the contact sidewall and in contact with the heater over the first current electrode wherein the phase change structure exhibits a first resistive value when in a first phase state and exhibits a second resistive value when in a second phase state.

7. The method of claim 6 wherein the heater includes first and second sidewall silicide portions and the heater wraps around a corner of the silicide portions.

8. The method of claim 6 wherein the forming the heater silicide includes siliciding a second portion of the first structure to form a third silicide structure, wherein the third silicide structure physically contacts the first current electrode.

9. The method of claim 6 wherein the heater includes cobalt.

10. The method of claim 6 wherein a thickness of the phase change structure over the portion of the first current electrode is more than half and less than a full thickness of the phase change structure in the separation region.

* * * * *